United States Patent [19]

Behrend

[11] 4,096,454
[45] Jun. 20, 1978

[54] AMPLITUDE AND DELAY EQUALIZATION OF SURFACE ACOUSTIC WAVE FILTERS IN AMPLITUDE MODULATION SYSTEM

[75] Inventor: William Louis Behrend, Pittsburgh, Pa.

[73] Assignee: RCA Corporation, New York, N.Y.

[21] Appl. No.: 779,677

[22] Filed: Mar. 21, 1977

[30] Foreign Application Priority Data

Apr. 6, 1976 United Kingdom ............... 13906/76

[51] Int. Cl.² .......................... H03C 1/06; H03C 1/60
[52] U.S. Cl. .................................. 332/37 R; 325/136; 325/182; 328/162; 332/45; 333/28 R; 333/29; 333/72
[58] Field of Search ................. 332/37 R, 31 R, 45; 325/136, 182; 333/29, 28 R, 30 R, 72; 328/162, 163

[56] References Cited

U.S. PATENT DOCUMENTS

| | | | |
|---|---|---|---|
| 3,315,171 | 4/1967 | Becker | 333/29 X |
| 3,621,221 | 11/1971 | Cann | 333/28 R X |
| 3,670,269 | 6/1972 | Starr et al. | 333/28 R X |
| 3,737,808 | 6/1973 | Srivastava | 333/28 R X |
| 3,899,666 | 8/1975 | Bolger | 333/30 R X |

*Primary Examiner*—Siegfried H. Grimm
*Attorney, Agent, or Firm*—E. M. Whitacre; P. J. Rasmussen; Robert L. Troike

[57] ABSTRACT

Amplitude and delay equalization of a surface acoustic wave filter used in the output of the amplitude modulated stage of a TV transmitter is disclosed. The equalization is provided by designing the filter to produce an amplitude ripple maximum or minimum at the visual carrier frequency. The video applied to the amplitude modulator is processed by a transversal equalizer such that the video is preprocessed to have an inverse amplitude and phase ripple with that produced by surface acoustic wave filter.

20 Claims, 9 Drawing Figures

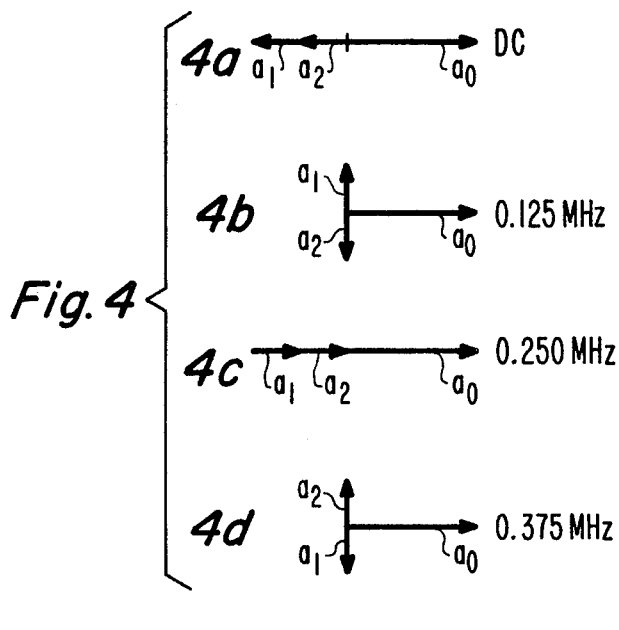
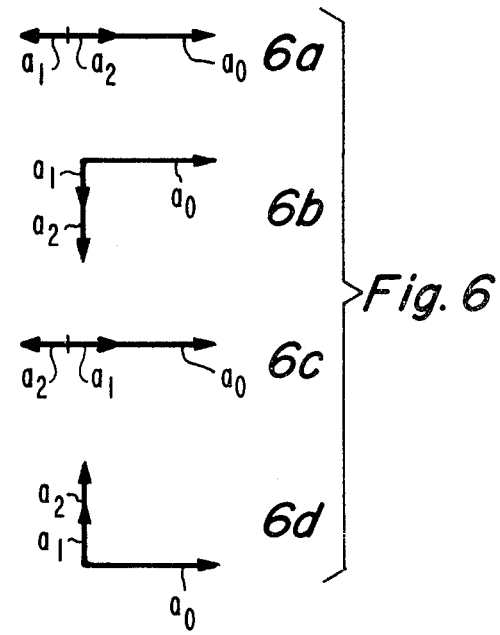
Fig. 4
Fig. 6
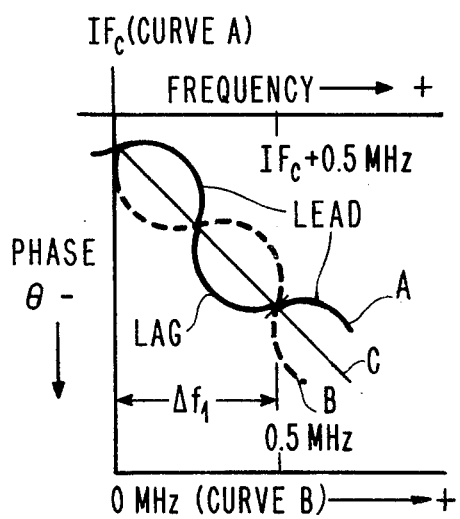
Fig. 5
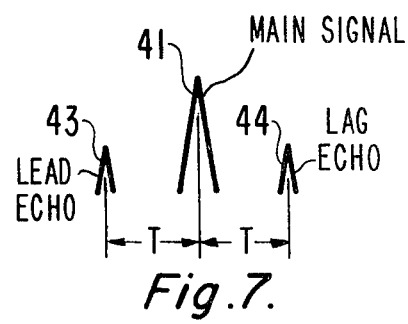
Fig. 7
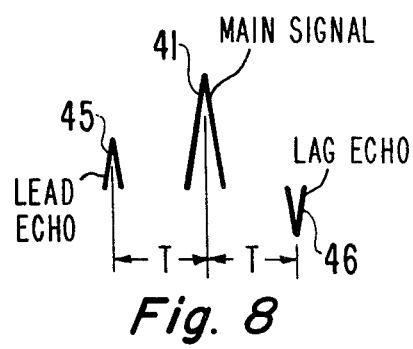
Fig. 8

AMPLITUDE AND DELAY EQUALIZATION OF SURFACE ACOUSTIC WAVE FILTERS IN AMPLITUDE MODULATION SYSTEM

BACKGROUND OF THE INVENTION

This invention relates to surface acoustic wave filters in amplitude modulation systems and, more particularly, to amplitude modulation broadcast transmitters using such filters.

In those television transmitters wherein conventional IF modulation is performed, inductive-capacitive (L-C) filters are utilized at IF so as to shape the signal and thereby meet the signal bandwidth and amplitude requirements imposed by the Federal Communications Commission. In addition thereto, all pass L-C or active phase equalizers are utilized either at baseband (video) frequency or IF to equalize the delay introduced by the L-C filters. The use of IF L-C filters for signal shaping requires that the filters be tuned at the factory, whereas the delay equalization at video frequencies is dependent upon the vestigial slope of the demodulator located in the receiver. This dependency introduces distortion at the receiver.

Another type of television broadcast transmitter is described in U.S. Pat. No. 3,955,155 issued on May 4, 1976, to RCA Corporation, based on the invention of William Behrend, entitled "Amplitude Modulation System." The system described therein achieves the required signal shaping by the use in the IF stage of a vestigial sideband filter (VSBF) followed by a delay equalizer. The sideband filter and equalizer is typically tuned in the factory thereby rendering filter replacement at the broadcast station difficult. In addition thereto, the characteristics of the filter change with time.

Surface acoustic wave (SAW) filters are quite flat in amplitude response and linear in phase. They have the fault, however, in that there are amplitude ripples and phase ripples caused by a multiple transit signal reflected from the receiving and sending ends that adds to the direct signal at the output. If the output wave is the sum of the direct wave and the multiple transit wave, the phase ripples and amplitude ripples are related and have the same period. The magnitude of the multiple transit signal and thus the magnitude of the phase and amplitude ripples are determined by the insertion loss of the filter. The amplitude ripples and the phase ripples cause echoes in the TV signal, producing distortion in the TV signal. This distortion exceeds that suitable for high quality TV broadcasting.

SUMMARY OF THE INVENTION

Briefly, amplitude and/or delay equalization of a surface acoustic wave filter used as a carrier frequency bandpass filter is provided by adjusting the filter and/or the carrier frequency to produce an amplitude ripple that is maximum or minimum at the carrier frequency of the signal waves being filtered and the intelligence or modulating signals are processed such that over the bandwidth of the filter the signal has an inverse amplitude and/or phase ripple with that produced by the surface acoustic wave filter.

BRIEF DESCRIPTION OF THE DRAWINGS

FIG. 4 illustrates the summing amplitude in the transversal equalizer of FIG. 3.

FIG. 5 is a plot of phase vs. frequency illustrating the phase ripple of the surface acoustic wave filter and the desired video phase ripple from the transversal equalizer.

FIG. 6 are phasors representing the summing in the transversal equalizer.

FIG. 7 illustrates the main signal and the amplitude echoes.

FIG. 8 illustrates the main signal and the phase echoes.

DESCRIPTION OF THE INVENTION

Figure 1:
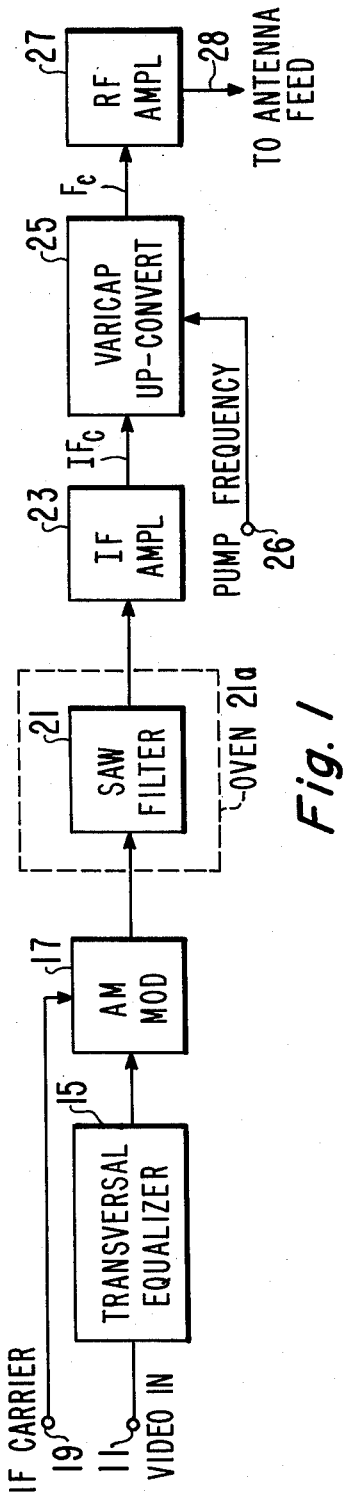
FIG. 1 is a block diagram of a TV transmitter using a surface acoustic wave filter.
Figure 2:
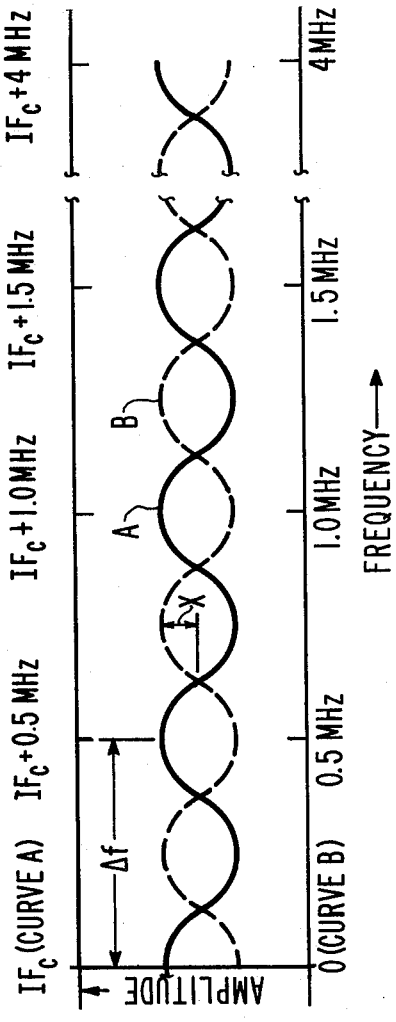
FIG. 2 is a plot of frequency vs. amplitude illustrating the amplitude ripple of the filter and the transversal equalizer.

Referring to a block diagram of FIG. 1, a UHF television transmitter utilizing IF modulation is illustrated. Video at signal terminal 11 is applied to a transversal equalizer 15. The transversal equalizer 15 operates on the video signal by adding to the main signal small different amplitudes of the signal that lead and lag the main signal at various amounts of time increments. The processed video is applied as a modulating signal to amplitude modulator 17. An IF carrier signal at terminal 19 is amplitude modulated by the modulating signal from the transversal equalizer 15 at modulator 17 and applied to filter 21. Filter 21 is a vestigial sideband filter adapted to pass signals with low attenuation from 0.75 $MH_z$ below the carrier frequency to about 4.2 $MH_z$ above the carrier frequency. In accordance with the invention herein this filter 21 is a surface acoustic wave (SAW) filter. The vestigial sideband filtered signal is amplified at IF amplifier 23 and upconverted via a variable capacity diode upconverter 25 to the desired carrier (channel) frequency $F_c$. An upconverting pump frequency is applied to upconverter 25 via terminal 26. The upconverted carrier RF frequency is amplified via RF amplifier 27 and applied to an antenna via feed 28. The system of FIG. 1 uses the surface acoustic wave filter 21 and a transversal equalizer 15 for correcting the phase and amplitude ripples associated with the surface acoustic wave filter 21. In order to reduce the ripples, the surface acoustic wave filter length is selected to produce an amplitude ripple that is either maximum or minimum at the IF visual carrier frequency ($IF_c$). In the preferred embodiment described herein the filter length is set such that the amplitude ripple from the filter is maximum at the IF visual carrier frequency as indicated by curve A of FIG. 2. The amplitude of the ripple A of FIG. 2 is maximum at this IF carrier frequency $IF_c$. Although not shown, this ripple extends below the $IF_c$ carrier frequency. This adjustment can also be made by operating the filter in a temperature controlled oven 21a (indicated by dashed lines) and by adjusting the filter operating temperature to that which places a maximum of the filter frequency response at the carrier frequency. Also, the IF carrier frequency $IF_c$ could be adjusted to provide response that is maximum at the SAW filter. By setting the SAW filter response maximum or minimum at the visual carrier frequency makes it possible to amplitude and phase equalize the effects of the SAW filter via the transversal equalizer 15. The amplitude ripples are equalized for the setting where amplitude is maximum at the IF carrier frequency by processing the video signal such that the amplitude of the output signal from the transversal equalizer 15 follows dashed curve B in FIG. 2 over the frequency band from zero frequency or DC to 4 $MH_z$. This curve B illustrates an inverse ripple amplitude from 0 $MH_z$ or DC to 4 $MH_z$ from that of curve A between intermediate carrier frequency $IF_c$ to $IF_c + 4$ $MH_z$. This video processing or shaping for amplitude ripple may be provided for example by the transversal equalizer of FIG. 3 having a delay 31 with taps 32, 33 and 35. The video input signal is applied to a tapped delay line 31, wherein a first major portion of the signal is delayed T seconds between taps 32 and 33 and another portion is delayed another T seconds between taps 33 and 35. The time delay T between the taps 32 and 33 and between taps 33 and 35, is equal to $1/\Delta f$, where $\Delta f$ is the frequency of the amplitude ripple produced by the IF SAW filter 21. For example, if there are eight ripples in the 4 $MH_z$ pass band from $IF_c$ to $IF_c + 4$ $MH_z$, the ripple frequency $\Delta f$ would be equal to 4 $MH_z/8$ which equals 0.5 $MH_z$ and $T = 2$ microseconds. The delay 31 may be a tapped coil delay line.

The majority of the signal amplitude $a_0$ is delayed time T and coupled out of tap 33. A small portion is delayed another time T and coupled out of tap 35. The signals at delay taps 32, 33 and 35 are summed in the summing device 37. A selected portion $a_1$ of the signal is applied via lead 32a to the negative terminal 37b of summing device 37. A selected portion $a_0$ of the applied signal is coupled via lead 33a to the positive terminal 37a of summing device 37 and a selected portion $a_2$ of the signal is coupled via lag lead 35a to the negative terminal 37c of summing device 37. The amplitude level $a_1$ taken from terminal 32 equals the amplitude level $a_2$ taken at terminal 35. The lead and lag signals of levels $a_1$ and $a_2$ add up when in phase to equal amplitude X in FIG. 2 which is the maximum amplitude of the ripple above or below the RMS level at the output of the SAW filter. At zero frequency or DC the lead and lag output signals at taps 32 and 35 both subtract from the main signal at terminal 33 to thereby provide minimum signal level at DC. See the diagram of FIG. 4a. Likewise at 0.5 $MH_z$ the lead and lag outputs from terminals 32 and 35 are in the same phase relationship and they subtract at the output from terminal 33 providing a minimum signal. This minimum signal occurs every 0.5 $MH_z$ (0.5 $MH_z$, 1 $MH_z$, 1.5 $MH_z$, 2 $MH_z$, 2.5 $MH_z$, 3 $MH_z$, 3.5 $MH_z$ and 4 $MH_z$) as indicated by curve B of FIG. 2. At the frequency midway between these full 0.5 $MH_z$ cycles (0.25 $MH_z$ for example) the phase produced by the delay 31 will be such as to produce signals at lead and lag taps 32 and 35 which add $(a_1 + a_2)$ to the signal $a_0$ at tap 33 to thereby produce maximum signal $(a_0 + a_1 + a_2)$ at these frequencies. See the diagram of FIG. 4c. At approximately, 0.125 $MH_z$ and 0.375 $MH_z$, for example, the output at lead and lag taps 32 and 35 are out of phase with each other $(a_1 - a_2)$ producing (See diagrams 4b and 4d respectively) cancelling lead and lag signal levels of equal amounts so as to produce only the signal at reference level $a_0$ at delay tap 33. At the frequencies between these points, the relative signal levels $a_1$ and $a_2$ at delay taps 32 and 35 in combination with their relative phase with respect to each other produces an output signal amplitude as a function of video frequency which follows the shape of curve B in FIG. 2. The summer 37 in the transversal equalizer may be an operational amplifer with the delay line 31 taps 32 and 35 coupled via resistors 38 and 39 to the inverting terminal and tap 33 coupled via resistor 40 to the non-inverting terminal. The resistors 38, 39 and 40 and the feedback resistors to the inverting and non-inverting terminals of the operational amplifier adjust the relative level of $a_1$, $a_0$ and $a_2$.

As mentioned previously, there is also a phase ripple at the output of surface acoustic wave filter. FIG. 5 illustrates this phase characteristic. The straight line C in FIG. 5 illustrates an ideal linear phase characteristic of negative phase vs. frequency. The output phase ripple of the SAW filter is illustrated in curve A of FIG. 5. For example, as the frequency goes from IF carrier frequency $IF_c$ to $IF_c + 4$ $MH_z$ (curve A), the phase ripple at IF carrier is in phase and then leads the linear characteristic over a first frequency band and then lags over the next frequency band. The cycle is repeated several times over the total IF band. Although not shown, the ripple of curve A extends below the carrier frequency $IF_c$. The frequency spacing between full cycles is $\Delta f_1$ and is the frequency of the phase ripple of the IF filter. In a manner discussed previously, if there are eight cycles in a 4 $MH_z$ typical pass band, the phase ripple frequency would be 0.5 $MH_z$ and the time T would be $1/0.5$ $MH_z$ or two microseconds. Correction for this phase ripple can be provided as illustrated by an inverse phase ripple (curve B) of the video applied to the modulator over the DC to 4 $MH_z$ band.

Figure 3:
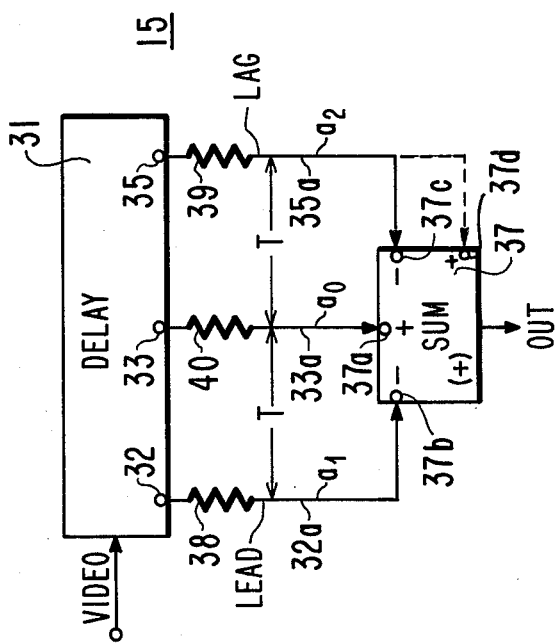
FIG. 3 illustrates the transversal equalizer of FIG. 1.

This signal processing to produce curve B of FIG. 5 can be achieved by using a transversal equalizer with a tapped coil delay line similar to delay 31 in FIG. 3. As mentioned previously, the transversal equalizer in FIG. 3 includes the taps 32, 33 and 35 on the delay 31 and the summer 37. In this case to achieve phase equalization alone, the lead tap 32 would be connected to a minus terminal 37b (inverting input) of the summer 37 and the lag tap would be connected to a plus (non-inverting input) terminal 37d of summer 37. (See dashed line in FIG. 3) At the zero or DC frequency, the lead and lag signals should cancel leaving only a signal at level $a_0$ as illustrated in the diagram of FIG. 6a. As the frequency increases, the lead signal of level $a_1$ is phase shifted less and the lead phasor moves counter clockwise and the lag phasor moves clockwise. If the frequency $\Delta f_1$ is 0.5 $MH_z$, then at the frequency 0.125 $MH_z$ the phasors representing lead signal at level $a_1$ and lag signal at level $a_2$ would be in phase with each other and pointing south as indicated in FIG. 6b. At the frequency 0.25 $MH_z$, the phasors representing the signal would be like that in FIG. 6c. At the frequency of 0.375 $MH_z$, the signals would be represented in FIG. 6d. The amplitude levels of $a_1$ and $a_2$ would be related to the ripple deviation of the phase in radians. For example, if the maximum magnitude deviation of the ripple was 0.034 radians, the lead and lag relative divider taps in delay 31 would be selected to each produce signal levels $a_1$ and $a_2$ of amplitude equal to 0.017 of $a_o$. The ratio of the amplitude can be used to approximate the angle. The tangent of the angle for small angles is approximately equal to the ratio of the amplitude. The summer 37 in the transversal equalizer 15 may be an operational amplifier with the taps 33 and 35 coupled to the non-inverting input and tap 32 coupled to the inverting input. The resistors 38, 39 and 40 and the feedback resistors to the non-inverting and inverting inputs of the operational amplifiers adjusts the relative levels of $a_1$, $a_o$ and $a_2$.

A typical signal out of the surface acoustic wave filter would consist of a main signal 41 as illustrated in FIG. 7 plus lead and lag echo signals 43 and 44 on either side of the main signal. The lead and lag echoes associated with the amplitude ripple are of the same polarity as illustrated by 43 and 44 and equally spaced (Time T) on either side of the main signal. The lead and lag echoes associated with the phase ripple are represented in FIG. 8 wherein the lead echo 45 and lag echo 46 are equally spaced from the main signal 41. The echoes 46 on the lag side is of the opposite polarity with respect to the main signal 41 and the lead echo signal 45. Therefore, the lag echoes 44 and 46 produced by the SAW filter amplitude and phase ripples act to cancel each other leaving the only echo needed to be corrected being the lead echo. In a system where the amplitudes $a_1$ and $a_2$ are the same value for both phase and amplitude, the correction for these echoes can be accomplished by a transversal equalizer 15 like that in FIG. 3 using a single delay 31 without using the lag tap 35 and using only the lead tap 32 to the inverting input of summer 37 where the input tap resistor 38 value is selected to provide twice the level ($2_{a_1}$) required to correct the amplitude delay alone at the negative terminal of the summer 37. The SAW filter 21 may be for example L84, L85 or L87 from Andersen Labs, Inc., 1280 Blue Hills Avenue, Bloomfield, Conn. 06002. The following data is associated with these filters:

Δf ripple frequency: 0.7 MH$_z$
amplitude ripple: ± 3.4%
phase ripple: 1.95° = 0.034 radians Since the ripple frequency of these filters is 0.7 MH$_z$, the time delay T in the equalizer 15 for these filters is equal to 1.428 microseconds. For amplitude correction alone, 0.017 of $a_o$ amplitude is coupled by both the lead and lag taps 32 and 35 which when added together equals the approximate + 3.4% of $a_o$. Since the phase ripple is 0.034 radians or 0.017 of $a_o$ for each tap signal, only the lead and main signal taps need to be used to correct for amplitude and phase ripple with 2 × .017 of $a_o$ or .034 coupled from the lead tap 32 of delay 31 (lead time T = 1.428 microseconds) to the negative terminal 37b of summer 37 and $a_o$ coupled to terminal 37a of summer 37.

The example described above illustrated the use of one tap in addition to the main tap on the delay to correct for a reflected signal, such as a triple-transit spurious signal, adding to the direct signal within the surface acoustic wave filter. Additional spurious signals may exist such as bulk modes and edge reflections. Bulk modes are bulk waves that travel straight through the material and are not as efficiently transferred as the surface waves. The bulk waves can cause some performances degradation by adding to the surface waves at the filter output. Edge reflections are signals reflected from the edges of the substrate. One edge reflection is that caused by the transducer radiated signal that is propagated in the opposite direction to the direction of the receiving transducer and it is not completely absorbed by an acoustic absorber placed behind the input transducer.

When there is more than one reflected signal, the amplitude response and phase characteristic of the surface acoustic wave filter can be expanded into two fourier series. The components of the amplitude response that are mirror symmetrical (even function) about the amplitude axis at IF carrier frequency, and the components of the phase characteristic that are skew symmetrical (odd function) about the phase axis at IF carrier frequency, can be corrected with the transversal equalizer delay in a similar manner as that described above. This would necessitate a plurality of lead and lag taps at the appropriate position along the delay to the summer. Correcting in this manner provides the same vestigial demodulator performances, independent of demodulator vestigial slope, as if the amplitude and phase corrections had been made at the IF or RF frequency. It may be necessary to adjust the operating temperature of the surface acoustic wave filter, or adjust the visual carrier frequency, to place the components at even and odd functions about the visual carrier.

Although in the above described arrangement the filter response was set at maximum at the IF carrier frequency, the system could equally well have been set up such that the response was minimum at the IF carrier frequency and hence the correction from 0 to 4 MH$_z$ would be such as to provide the characteristics of per curve A in FIGS. 2 and 5 for amplitude and phase. The system using the surface acoustic wave filter is also applicable to the system discussed in U.S. Pat. No. 3,955,155 of William Behrend. The surface acoustic wave filter replaces the vestigial sideband filter (VSBF) and the transversal equalizer would be placed between the video input and the four diode modulator.

Figure 9:
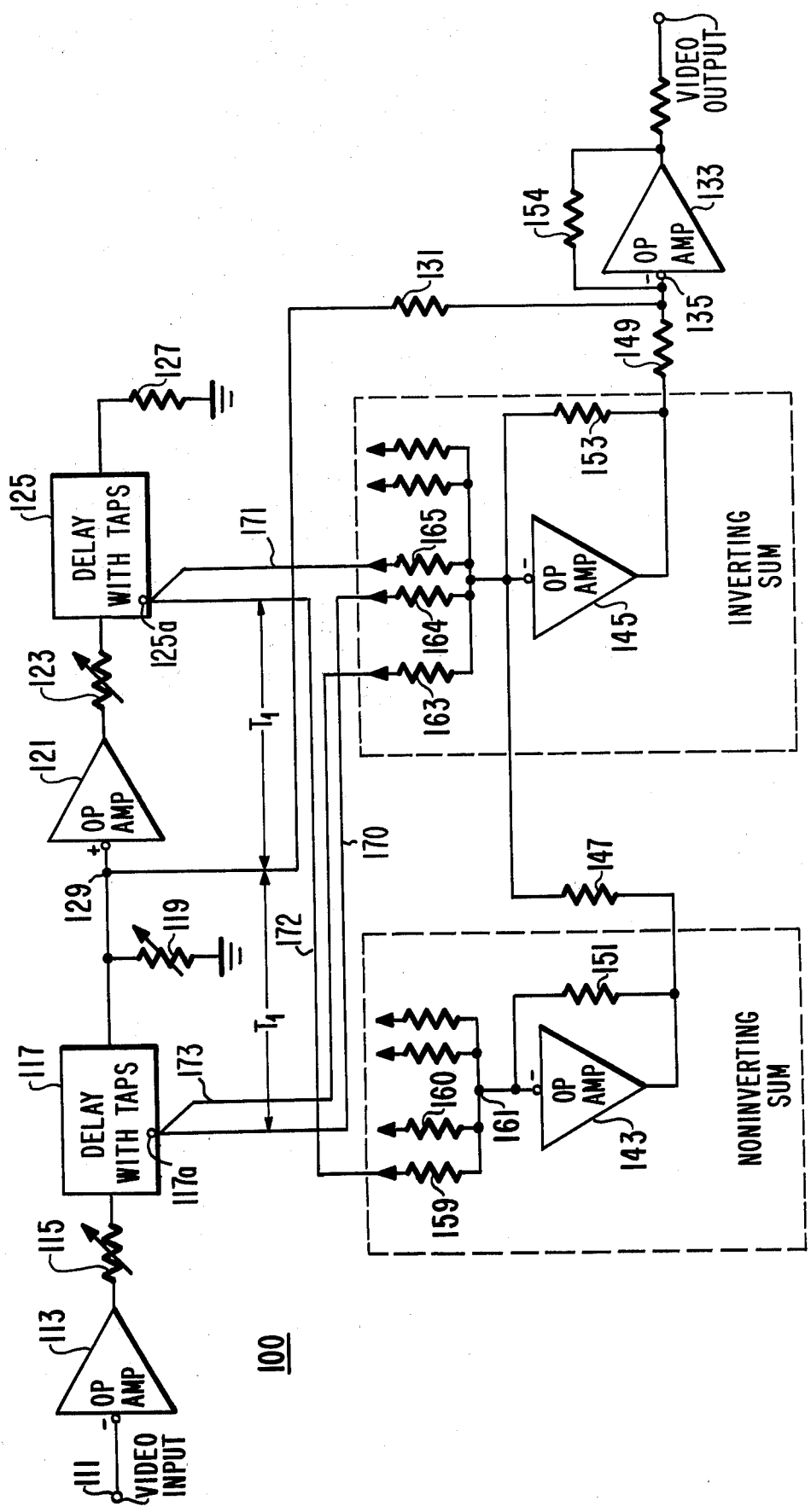
FIG. 9 is a diagram of a transversal equalizer in accordance with another embodiment of the present invention.

The transversal equalizer 15 using operational amplifiers may be like that illustrated in connection with FIG. 9. Referring to FIG. 9, the video input signal at terminal 111 is applied to the inverting input of operational amplifier 113. The output of operational amplifier 113 is applied through a resistor 115 to a first tapped delay line 117. The output of delay line 117 is coupled to terminal point 129 and the non-inverting input of operational amplifier 121. A variable resistor 119 is coupled between the output of tapped delay line 117 and ground or reference potential. The output of operational amplifier 121 is applied through resistor 123 to tapped delay line 125. The output of tapped delay line 125 is terminated through resistor 127 to ground or reference potential. The terminal point 129 between tap delay lines 117 and operational amplifier 121 is coupled through a resistor 131 to the input of operational amplifier 133. The lead and lag taps of tapped delays 117 and 125 respectively can be coupled to either the inverting terminal of operational amplifier 143 or operational amplifier 145. The inverted output of the operational amplifier 143 is coupled via resistor 147 to the inverting input of operational amplifier 145 and the output of inverting operational amplifier 145 is coupled via resistor 149 to the inverting input 135 of operational amplifier 133. The operational amplifiers 143, 145, and 133 each have feedback resistors 151, 153 and 154 respectively. The operational amplifier 113 has a very low output impedance. Resistor 115 at the output of the operational amplifier 113 provides a good termination to the tap delay line 117 and the absorption of reflections. The adjustable resistor 119 terminates the output of tapped delay line 117 at the divided output end. The operational amplifier 121 drives the second delay line. The operational amplifier 121 provides a good termination to the delay line 117 and with resistor 123 isolates any effects of reflection in the second delay line 125 from affecting the quality of the main signal at terminal 129. The operational 121 also corrects for insertion losses so as to make the signals through the delay lines 117 and 125 equal in amplitude. The operational amplifier 143 is an inverting summing device. The tapped signals from the delays 117 and 125 are applied through equal valued resistors 159 and 160 for example to the input of the operational amplifier 143. The operational amplifiers are current responsive dividers. The resistors 159 and 160 develop current levels to these operational amplifiers of the operational amplifier 143. Since the tap inputs are to the inverting inputs of the operational amplifiers, these inputs are at virtual ground. This prevents coupling between the tap points on the delay line which would cause disturbances in the main signal. This is particularly useful when there are many taps when correcting for other ripples in addition to triple transit ripple. The gain at the output of operational amplifier 143 is determined by the ratio of the input resistors 159 and 160 for example and the feedback resistor 151. The inverted output from the operational amplifier 143 is applied through resistor 147 to the inverting input of operational amplifier 145 where is it inverted. Since the output from operational amplifier 143 is inverted twice before being applied to summer operational amplifier 133, the resultant is not inverted and this output is considered the non-inverting sum. Also coupled to the inverting input of operational amplifier 145 are input resistors 163 and 165 for example. These resistors may be coupled to taps on either or both delay lines 117 and 125. Since the inverting inputs are at virtual ground, there is no coupling between the tap points along the delay lines at the input to the operational amplifier 145. The gain of the operational amplifier 145 is adjusted by the relative values of resistors 163, 164 and 165 at the input of operational amplifier 145 and the value of the feedback resistor 153. The resistors 151, 153 and 147 are of equal resistance so that the amplitudes of the delayed or leading signals are determined by the magnitudes of the resistors 159, 160, 163, 164 and 165. Since resistors 147 and 153 are of equal value, operational amplifier 145 provides unity gain to these signals from operational amplifier 143. If the resistors 159, 160, 163 and 165 are of equal value, the lead and lag signals added to the operational amplifier 133 are of the same value. The leading and lagging signals are added to the main signal at the input 35 of the operational amplifier. The operational amplifier 143 is used for signals that do not require a polarity change relative to the polarity of the main signal at the time delay of $T_1$ (point 129). Operational amplifier 145 is used for signals that require a polarity change. In the above described system for equalizing the amplitude alone associated with the triple transit ripple, the above described transversal equalizer would achieve the response characteristic by the delay 117 and 125 being tapped at point 117a and 125a respectively, which each provide two microsecond ($T_1$ = 2$\mu$sec) delays. The resistor 164 is coupled via line 170 to delay 117 at tap point 117a and resistor 165 is coupled via line 171 to delay 125 at tap point 125a. The values of resistors 164 and 165 relative to resistor 153 is adjusted to provide the desired amplitude levels of $a_1$ and $a_2$. The inverting operational amplifier 145 is used since the signals are negative with respect to the main signal at point 129. The majority of the signal $a_o$ is coupled via resistor 131. To achieve the above described phase correction alone, the operational amplifier 143 and operational amplifier 145 would be used with resistor 159 for example being coupled via line 172 to tap delay 125 at point 125a resistor 163 is coupled via line 173 to tap point 117a on delay 117. Again, the tap points 117a and 125a on both delays 117 and 125 would be at the two microsecond delay points. In the combined amplitude and phase ripple correction system discussed above, only resistive tap 163 would be used to correct triple transit and this resistor is coupled via line 173 only to tap point 117a of delay 117 with the value of resistor 163 relative to 153 adjusted to double the amplitude level ($2_{a_1}$) provided previously. The gain adjustment can be provided by the relative value of resistors 149 and 131 relative to feedback resistor 154.

What is claimed is:

1. In an amplitude modulation system of the type including an amplitude modulator responsive to carrier waves and intelligence signals for providing amplitude modulated carrier signals, the improvement therein comprising: a band pass filter for passing signals with low attenuation over a desired carrier frequency band coupled to said amplitude modulator, said filter being a surface acoustic wave filter having an amplitude response being a selected one of maximum or minimum amplitude at a carrier frequency of said modulation system and said filter inherently producing amplitude ripples over the passband, and means responsive to said intelligence signals for distorting the intelligence signals to have an inverse amplitude ripple with resepct to that produced by the surface acoustic wave filter.

2. The combination claimed in claim 1, wherein said filter is a vestigial sideband filter and said intelligence signals are television video signals.

3. The combination claimed in claim 1, wherein said means for distorting includes a transversal equalizer having a delay line, a main signal tap and a lead signal tap on said delay line and summing means coupled to said lead tap and main signal tap.

4. The combination claimed in claim 3 wherein the time delay between the main signal tap point and the lead signal tap point is equal to T, wherein T is equal to 1/$\Delta f$, where $\Delta f$ is equal to the frequency of the amplitude ripple.

5. The combination claimed in claim 4 including a lag signal tap point on said delay line and the time delay between the main signal tap point and the lag signal tap point is equal to T, said summing means being coupled to said lag signal tap point.

6. In an amplitude modulation system of the type including an amplitude modulator responsive to carrier waves and intelligence signals for providing amplitude modulated carrier signals, the improvement therein comprising: a surface acoustic wave filter coupled to said amplitude modulator for passing signals with low attenuation over a desired carrier frequency band, said filter inherently producing phase ripples over the passband, said surface acoustic wave filter having an amplitude response at a selected one of maximum or minimum amplitude at a carrier frequency of said modulation system, and means responsive to said intelligence signal for distorting the intelligence signal to have an inverse phase ripple with respect to that produced by the surface acoustic wave filter.

7. The combination claimed in claim 6 wherein said means for distorting includes a transversal equalizer with a delay line having a main signal tap point, a lead signal tap point and a lag signal tap point wherein the delay between the main signal tap point and the lead and lag signal tap points is T, where T is equal to 1/$\Delta f$, where Δf is the frequency of the phase ripple produced by the surface acoustic wave filter.

8. In an amplitude modulation system of the type including an amplitude modulator responsive to carrier waves and intelligence signals for providing amplitude modulated carrier signals, the improvement therein comprising: a surface acoustic wave filter coupled to said amplitude modulator for acting as a band pass filter for carrier signals amplitude modulated by said intelligence signal which filter inherently produces amplitude and phase ripples over the pass band, said surface acoustic wave filter having an amplitude response at a selected one of maximum or minimum amplitude at a carrier frequency of said modulation system, means responsive to said intelligence signal for distorting the intelligence signal to have over said passband an inverse amplitude and phase ripple with respect to that produced by the surface acoustic wave filter.

9. The combination claimed in claim 8 wherein said means for distorting includes a transversal equalizer with a delay line having a main signal tap point and a lead signal tap point and a summing means coupled to said main and said lead signal tap points.

10. The combination claimed in claim 9 wherein the time delay between the main signal and the lead signal tap points is equal to T, where T is equal to 1/Δf, where Δf is equal to the frequency of the amplitude and phase ripple.

11. The combination claimed in claim 10, wherein the amplitude level of the lead signal is twice that required to equalize the amplitude ripple alone.

12. In a transmitter of the type including:

an amplitude modulator responsive to carrier frequency signals and modulating signals for providing at the output thereof amplitude modulated carrier signals, the improvement therein comprising:

a surface acoustic wave filter coupled at the output of said modulator for passing signals with low attenuation over a desired carrier frequency band, said acoustic wave filter inherently producing amplitude and phase ripples over the passband, said surface acoustic wave filter amplitude response being at a selected one of maximum or minimum at the carrier frequency, and a transversal equalizer coupled at the input of said amplitude modulator and responsive to said modulating signal for preprocessing said modulating signals over the band width of the filter so that the modulating signal has an inverse amplitude and phase ripple with that produced by the surface acoustic wave filter.

13. The combination claimed in claim 12, wherein said filter is a vestigial sideband filter and said modulating signals are television video signals.

14. The combination claimed in claim 12, wherein said transversal equalizer includes a delay line having a main signal tap and a lead signal tap and a summing means coupled to said lead tap and main signal tap.

15. The combination claimed in claim 14, wherein the time delay between the main signal and the lead signal tap points is equal to T, where T is equal to 1/Δf, where Δf is equal to the frequency of the amplitude and phase ripple.

16. The combination claimed in claim 15, wherein the amplitude level of the lead signal is twice that required to equalize the amplitude ripple alone.

17. In an amplitude modulation system of the type including an amplitude modulator responsive to carrier waves and signals representing intelligence information for providing amplitude modulated carrier signals, the improvement therein comprising:

a surface acoustic wave filter coupled at the output of said modulator for passing signals with low attenuation over a desired carrier frequency band, said filter response being at a selected one of maximum or minimum at the said carrier frequency and inherently producing response ripples over the passband, means including a transversal equalizer in circuit with said amplitude modulator and said filter for distorting the signals containing intelligence to have an inverse response ripple.

18. The combination of claim 17 wherein said filter has an amplitude resonse being selected at a maximum or minimum amplitude and said filter inherently produces amplitude ripples over the passband and said means for distorting causes the signals containing intelligence to have an inverse amplitude ripple with respect to that produced by the surface acoustic wave filter.

19. The combination of claim 17 wherein said filter inherently produces phase ripples and said means for distorting includes means for causing the signals containing intelligence to have an inverse phase ripple with respect to that produced by the surface acoustic wave filter.

20. The combination of claim 17 wherein said transversal equalizer includes a delay line having time delay taps along the length thereof for providing at the taps signals time delayed according to the position of the taps and means for summing said time delayed signals.

* * * * *

UNITED STATES PATENT OFFICE
CERTIFICATE OF CORRECTION

PATENT NO. : 4,096,454

DATED : June 20, 1978

INVENTOR(S) : William Louis Behrend

It is certified that error appears in the above-identified patent and that said Letters Patent are hereby corrected as shown below:

Column 5, lines 53 and 54, that portion reading "performances" should read -- performance --; Column 6, line 7, that portion reading "performances" should read -- performance --; lines 64 and 65, that portion reading "operational 121" should read -- operational amplifier 121 --; Column 7, line 65, that portion reading "125a resistor" should read -- 125a and resistor --; Column 8, line 26, that portion reading "resepct" should read -- respect --; Column 10, line 35, that portion reading "resonse" should read -- response --.

Signed and Sealed this

Nineteenth Day of December 1978

[SEAL]

Attest:

RUTH C. MASON
Attesting Officer

DONALD W. BANNER
Commissioner of Patents and Trademarks